(12) United States Patent
Ouvrard et al.

(10) Patent No.: US 10,727,331 B2
(45) Date of Patent: Jul. 28, 2020

(54) SEMICONDUCTOR DEVICE HAVING A REDUCED SURFACE DOPING IN AN EDGE TERMINATION AREA, AND METHOD FOR MANUFACTURING THEREOF

(71) Applicant: Infineon Technologies Austria AG, Villach (AT)

(72) Inventors: Cedric Ouvrard, Villach (AT); Adam Amali, Chandler, AZ (US); Oliver Blank, Villach (AT); Michael Hutzler, Villach (AT); David Laforet, Villach (AT); Harsh Naik, El Segundo, CA (US); Ralf Siemieniec, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/023,433

(22) Filed: Jun. 29, 2018

(65) Prior Publication Data

US 2019/0006513 A1    Jan. 3, 2019

(30) Foreign Application Priority Data

Jun. 30, 2017  (DE) .................. 10 2017 114 681

(51) Int. Cl.
*H01L 29/78*    (2006.01)
*H01L 29/66*    (2006.01)
(Continued)

(52) U.S. Cl.
CPC ...... *H01L 29/7813* (2013.01); *H01L 29/0615* (2013.01); *H01L 29/0619* (2013.01);
(Continued)

(58) Field of Classification Search
CPC combination set(s) only.
See application file for complete search history.

(56) References Cited

U.S. PATENT DOCUMENTS 6,054,752 A    4/2000 Hara et al.
9,620,636 B2   4/2017 Siemieniec et al.
(Continued)

FOREIGN PATENT DOCUMENTS

DE    102013112009 A1    4/2014
DE    102014112371 A1    3/2016

*Primary Examiner* — Nduka E Ojeh
(74) *Attorney, Agent, or Firm* — Murphy, Bilak & Homiller, PLLC

(57) ABSTRACT

A semiconductor device includes a semiconductor substrate having drift and body regions. The drift region includes upper and lower drift regions. An active area includes a plurality of spicular trenches extending through the body region and into the drift region. Each spicular trench in the active area has a lower end which together define a lower end of the upper drift region extending towards a first side and a lower drift region extending from the lower end of the upper drift region towards a second side. The edge termination area includes spicular termination trenches extending at least into the upper drift region. A surface doping region arranged in the upper drift region in the edge termination area extends to the first side, is spaced apart from the lower end of the upper drift region, and has a net doping concentration lower than that of the upper drift region.

12 Claims, 11 Drawing Sheets

(51) Int. Cl.
*H01L 29/739* (2006.01)
*H01L 29/06* (2006.01)
*H01L 29/40* (2006.01)
*H01L 29/10* (2006.01)

(52) U.S. Cl.
CPC ........ *H01L 29/0696* (2013.01); *H01L 29/407* (2013.01); *H01L 29/66348* (2013.01); *H01L 29/66734* (2013.01); *H01L 29/7397* (2013.01); *H01L 29/7811* (2013.01); *H01L 29/1095* (2013.01)

(56) References Cited

U.S. PATENT DOCUMENTS

| | | | |
|---|---|---|---|
| 2008/0121986 A1* | 5/2008 | Hshieh | H01L 29/407 257/328 |
| 2014/0117437 A1* | 5/2014 | Willmeroth | H01L 29/7802 257/329 |
| 2015/0206937 A1 | 7/2015 | Yedinak et al. | |
| 2016/0064547 A1* | 3/2016 | Siemieniec | H01L 29/7811 257/329 |
| 2019/0165159 A1* | 5/2019 | Wehrhahn-Kilian | H01L 29/7395 |

\* cited by examiner

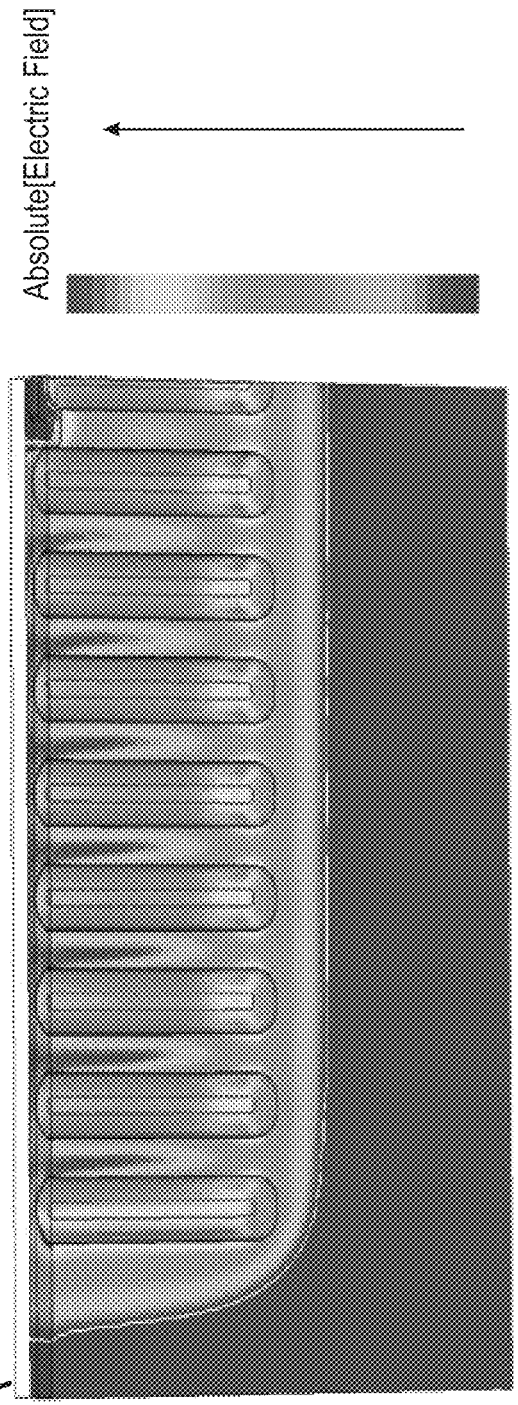
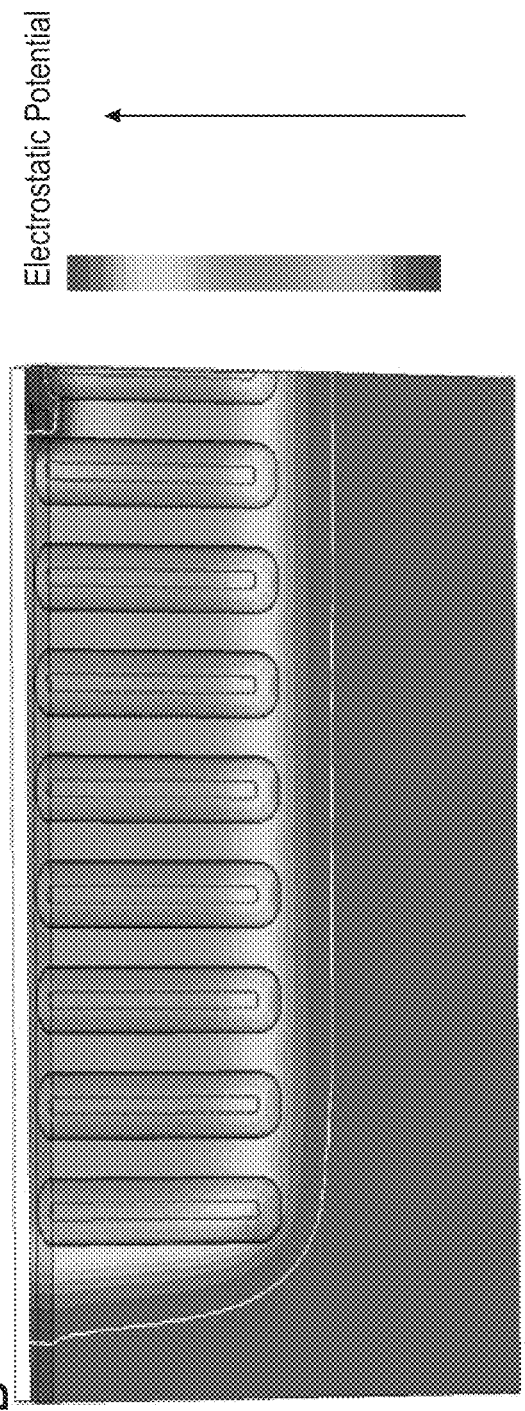
Fig. 4A
Fig. 4B

Impact Ionization

Electrostatic Potential

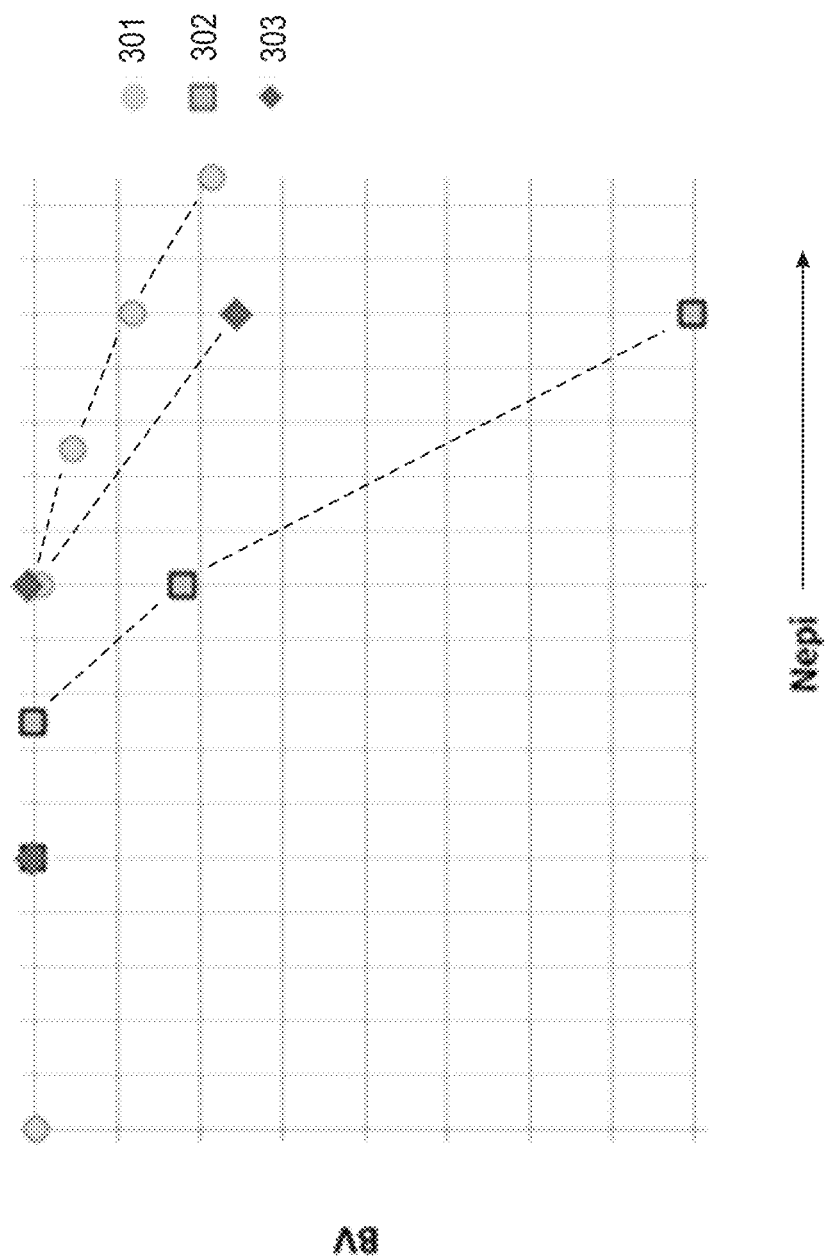

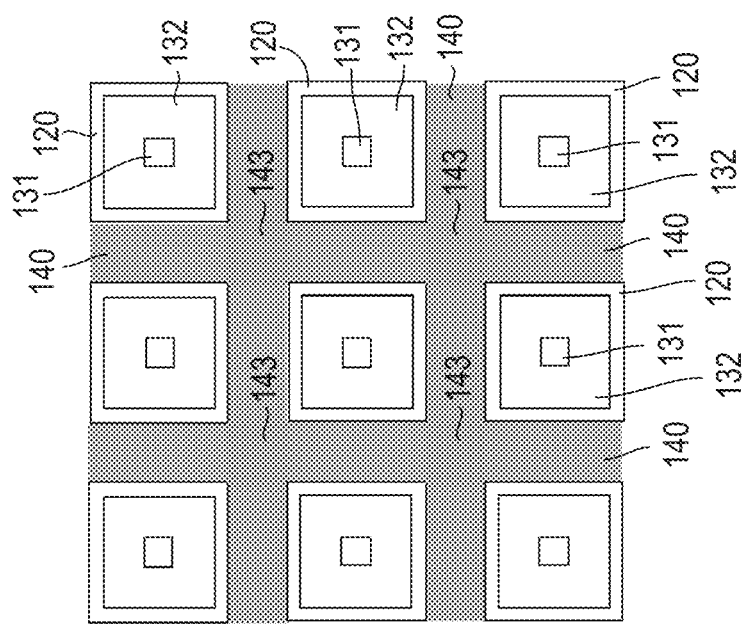
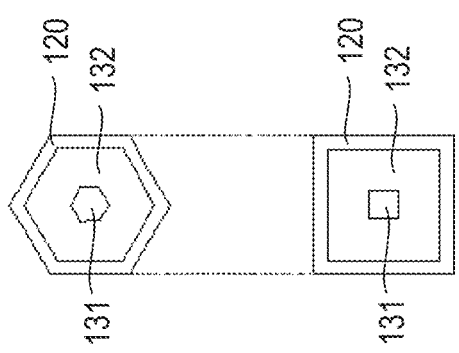
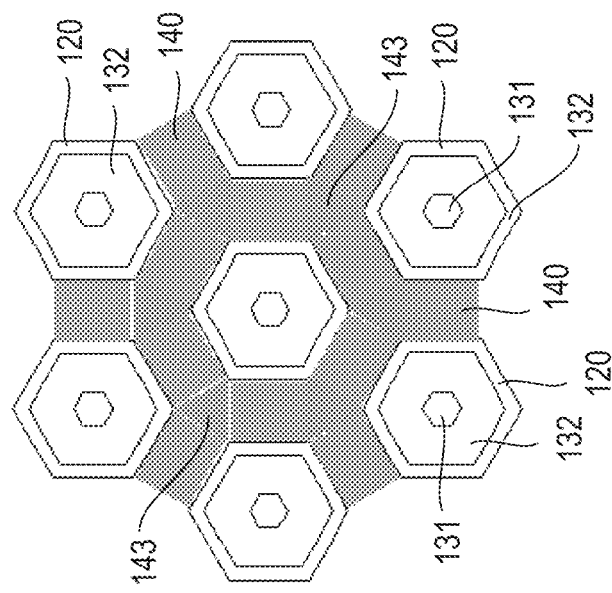

SEMICONDUCTOR DEVICE HAVING A REDUCED SURFACE DOPING IN AN EDGE TERMINATION AREA, AND METHOD FOR MANUFACTURING THEREOF

TECHNICAL FIELD

Embodiments described herein relate to semiconductor devices having a surface doping region with a reduced net doping concentration relative to a net doping concentration of an upper drift region of a drift region. Further embodiments pertain to methods for manufacturing semiconductor devices.

BACKGROUND

Semiconductor devices such as MOSFET using field electrodes for charge compensation have become very popular during the last decade as they offer a significant improvement of the area-specific resistance. The devices typically use a stripe design where the field electrodes and the mesa regions containing the gate electrodes are formed in the shape of long stripes which run parallel to each other.

More recent concepts employ a cell design having a hole-like deep trench, also referred to as spicular trench, containing the so-called field-plate in the centre of a given transistor cell. The deep trench containing the field-plate is surrounded by a separate gate trench. This cell design, also referred to as needle trench design due to the central deep field-plate shaped as oblong electrode, offers a larger cross-sectional area for the mesa region around the spicular trench than the stripe design. A larger cross-sectional area for the mesa is believed to further reduce the overall on-state resistance $R_{ON}$ of the semiconductor device.

For illustrating purposes, reference is made to FIGS. 11A and 11B which show schematics of unit cells of the stripe design in FIG. 11A and of the needle trench design in FIG. 11B. Assume that the unit cell has dimensions defined by a in length and width direction. We further assume that the width of the trench is a−w with w being the width of the mesa region. A trench for the field plate in the stripe design assumes an area equal to $a \cdot (a-w)$. Different thereto, the spicular trench only assumes an area of $(a-w)^2$ which means that the area left for the mesa region is larger in the needle trench design than in the stripe design. A larger cross-sectional area of the mesa results in a lower on-state resistance $R_{ON}$.

As with semiconductor devices of the stripe design, semiconductor devices having transistor cells of the needle trench design include a so-called edge termination region which surrounds an active region of the semiconductor device. The active region of a semiconductor device includes the active transistor cells which carry the electric current through the semiconductor device and which can be controlled by applying a gate voltage. The edge termination region is provided to maintain and improve the blocking capabilities of the semiconductor device when operated in blocking mode or off-state.

A breakdown of the semiconductor device may particularly happen at the outer rim of the semiconductor substrate of the semiconductor device due to crystal defects and a locally increased electrical field. The edge termination region is provided to control the relief of the electric field so that the occurrence of high electric fields at the outer rim or other regions susceptible to electrical breakdown can be avoided.

In view of the above, there is need for further improvement.

SUMMARY

According to an embodiment, a semiconductor device includes a semiconductor substrate having a first side, a second side opposite to the first side, a lateral rim, an active area, an edge termination area arranged between the active area and the lateral rim of the semiconductor substrate, a drift region of a first conductivity type and a body region of a second conductivity type, wherein the drift region includes an upper drift region and a lower drift region. The active area includes at least portions of the body region and a plurality of spicular trenches each having a field electrode and extending from the first side through the body region and into the drift region. Each of the spicular trenches in the active area has a lower end which lower ends together define a lower end of the upper drift region extending towards the first side. The lower drift region extends from the lower end of the upper drift region towards the second side. The edge termination area includes a plurality of spicular termination trenches extending from the first side at least into the upper drift region. The drift region has a surface doping region arranged in the upper drift region in the edge termination area and extending to the first side, wherein the surface doping region is spaced apart from the lower end of the upper drift region and has a net doping concentration lower than a net doping concentration of the upper drift region.

According to an embodiment, a method for manufacturing a semiconductor device includes: providing a semiconductor base substrate; forming an epitaxial layer on the semiconductor base substrate, the epitaxial layer and the semiconductor base substrate forming together a semiconductor substrate; forming a drift region comprising a surface doping region of a first conductivity type and an upper drift region of the first conductivity type in the epitaxial layer, the surface doping region having a net doping concentration lower than a net doping concentration of the upper drift region; forming a body region of a second conductivity type in an active area; forming, in an active area, a plurality of spicular trenches extending from the first side through the body region and into the drift region; and forming, in an edge termination area, a plurality of termination trenches extending from the first side into the upper drift region.

Those skilled in the art will recognise additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference signs designate corresponding parts. In the drawings:

FIGS. 4A and 4B illustrate the distribution of the electrical field and the electrostatic potential in an edge termination area of a semiconductor device which do not have a surface doping region.

FIG. 6 illustrates the dependency of the breakdown voltage for a semiconductor device having a surface doping region formed by counter-doping relative to semiconductor device which do not include surface doping regions.

FIG. 9A illustrates a regular arrangement of spicular trenches each having a cross section as shown in the upper part of FIG. 9B, and FIG. 9C illustrates a regular arrangement of spicular trenches each having a cross section as shown in the lower part of FIG. 9B, according to embodiments.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describe an ohmic connection between two elements.

The semiconductor device is at least a two-terminal device, an example is a diode. The semiconductor device can also be a three-terminal device such as a field-effect transistor (FET), insulated gate bipolar transistor (IGBT), junction field effect transistors (JFET), and thyristors to name few. The semiconductor device can also include more than three terminals.

Specific embodiments described herein pertain to, without being limited thereto, power semiconductor devices and particularly to devices which are controlled by a field-effect.

In the Figures, like reference signs designate corresponding parts.

A "plane projection" or a "plan view" intends to describe a virtual projection of structures, elements or regions on a reference plane for describing the arrangement of the structures, elements and regions relative to each other.

Figure 1:
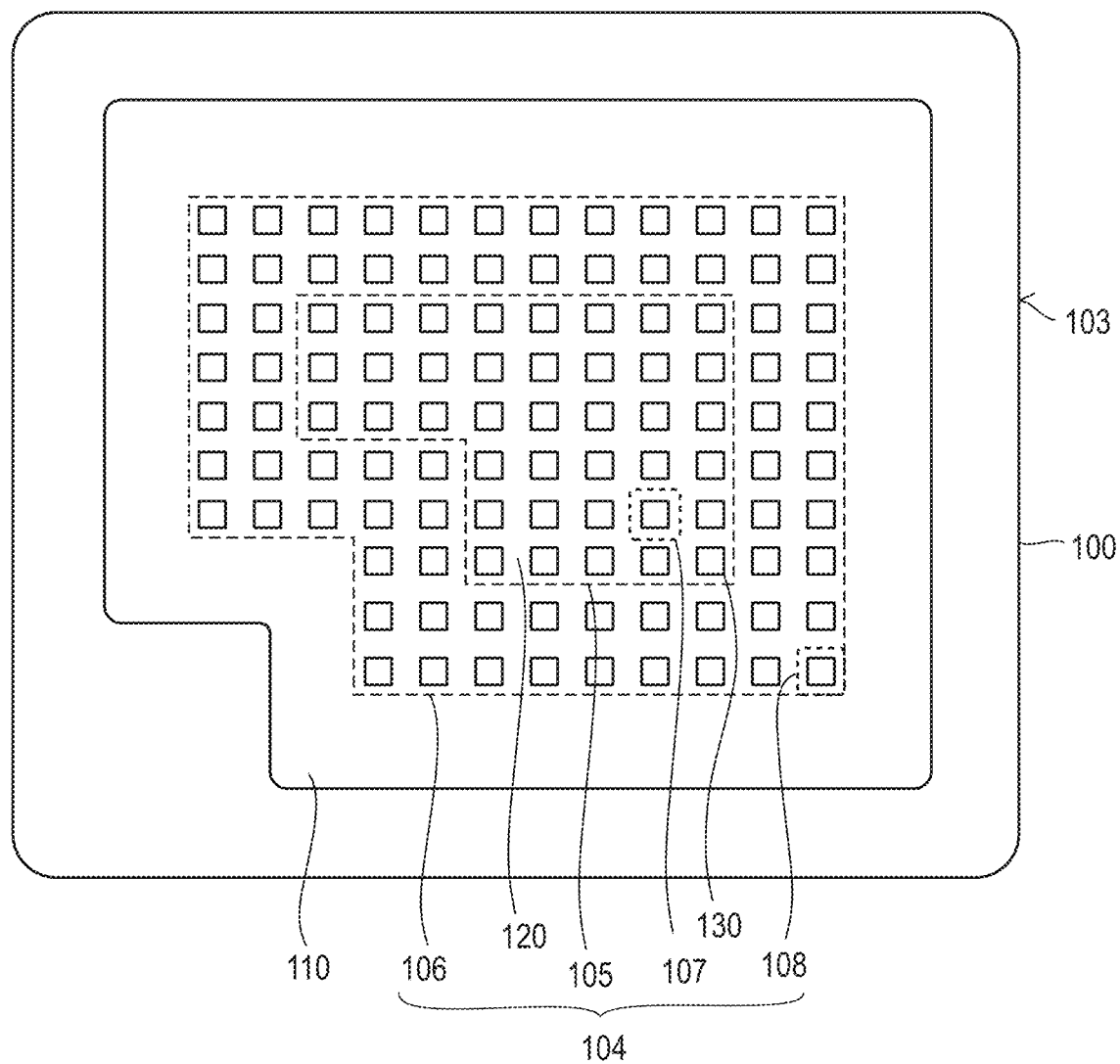
FIG. 1 illustrates a plan view onto a semiconductor device according to a first embodiment.

FIG. 1 illustrates a plan view onto a semiconductor device according to an embodiment. The semiconductor device includes a semiconductor substrate 100 having an outer rim 103, an active area 104, and an edge termination area 110 arranged between the active area 104 and the outer rim 103. The outer rim 103 defines the outer boundary of the semiconductor substrate 100 and limits the semiconductor substrate 100 by a circumferentially running vertical surface extending perpendicular to the main surfaces of the semiconductor substrate 100.

The active area 104 may include a transistor array having a plurality of transistor cells 107, 108 which can be arranged in a given pattern in the active area 104. The active area 104 may include active transistor cells 107, arranged in a central part of the active area 104, and inactive transistor cells 108 arranged in a region surrounding the region of the active transistor cells 107. The inactive transistor cells 108 may form a transition area 106 between an active cell area 105 defined by the active transistor cells 107 and the edge termination area 110.

Each of the transistor cells 107, 108 can include a spicular trench 130 which is described further below. Spicular trenches 130 can also be formed in the edge termination area 110 to improve the blocking capabilities of the semiconductor device. The edge termination area 110 can include a termination structure formed by spicular trenches and/or other structures such as doping regions which are provided to controllably relax the electrical field under blocking conditions.

Figure 2A:
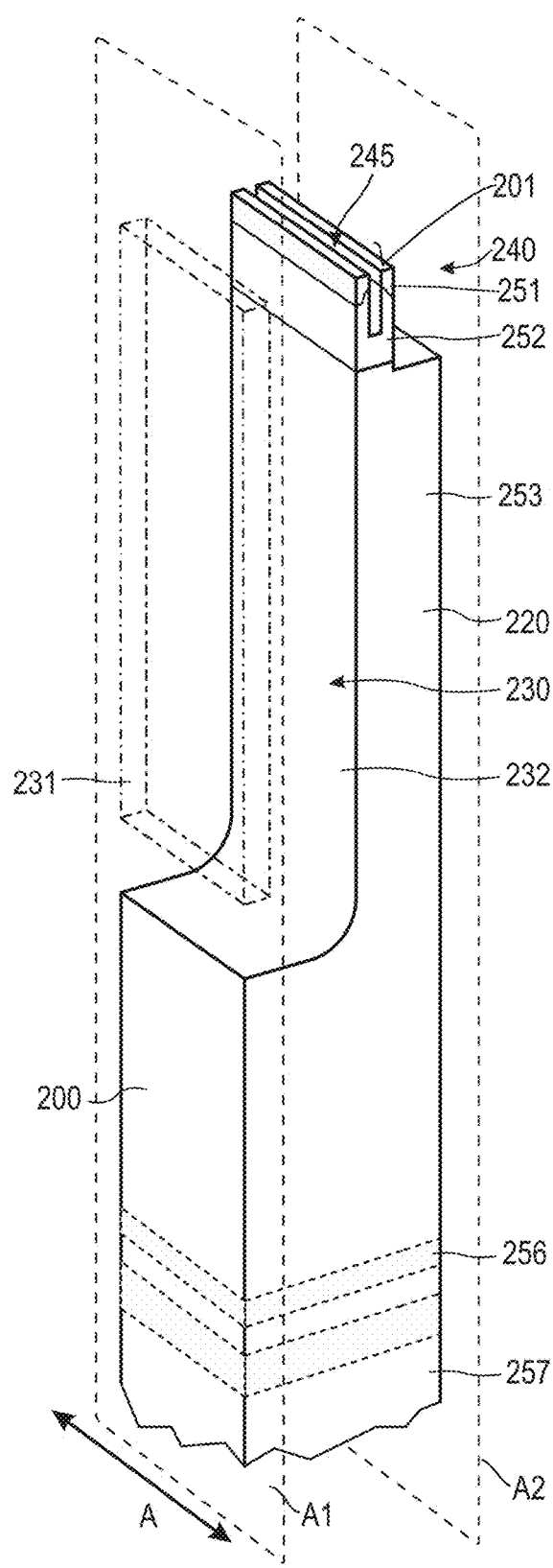
FIG. 2A illustrates a transistor cell having a strip design.
Figure 2B:
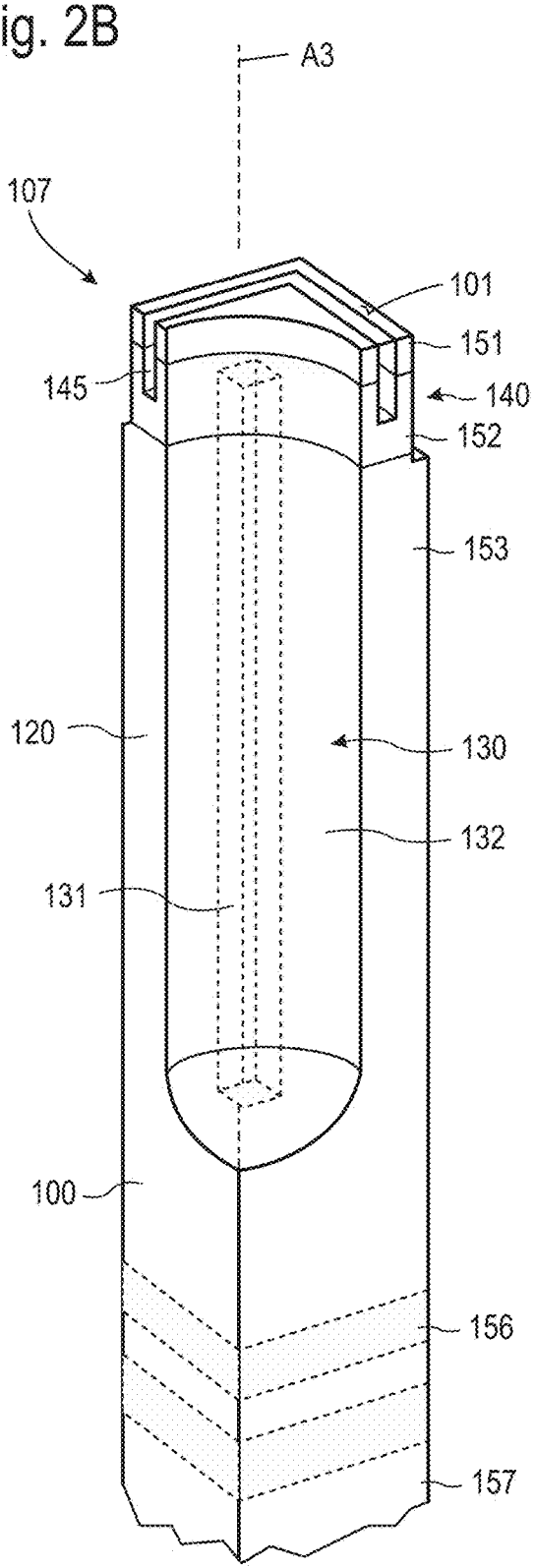
FIG. 2B illustrate a transistor cell having a needle trench design.

With reference to FIGS. 2A and 2B the differences between a transistor cell of the stripe design and a transistor cell of the trench needle design is explained in more detail. FIG. 2A shows a unit cell of the stripe design while FIG. 2B illustrates a unit cell of the trench needle design.

The transistor cell of FIG. 2A is formed in a semiconductor substrate 200 having a first side 201 and the second side. The first side 201 defines the main side or surface of the semiconductor substrate 200 while the second side defines a side opposite to the first side 201. The stripe design includes a long and deep field plate trench 230 which is formed to extend from the first side 201 of the semiconductor substrate into the semiconductor substrate 100. The field plate trench 230 has a stripe shape when seen in plain projection onto the first side 201 of the semiconductor substrate 200. Each field plate trench 230 includes a field electrode 231 which is indicated by phantom lines in FIG. 2A. The field electrode 231 has a plate-like shape parallel to the longitudinal extension of the field plate trench 230. A thick field oxide 232 electrically insulates the field electrode 231 from the semiconductor substrate 200. Next to and parallel with the field plate trench 230 is running a cell mesa region 220 extending up to the first side 201 of the semiconductor substrate 200.

The design as shown in FIG. 2A continues in the direction indicated by arrow A and is mirrored at the planes A1 and A2. The plane A1 runs parallel to and along a centreline of the field plate trench 230. The plane A2 runs parallel to and along a centreline of a gate trench 240 formed in the cell mesa region 220.

The gate trench 240 and the field plate trench 230 run parallel to each other. The stripe design thus includes stripe-shaped field plate trenches 230 with strip-shaped field electrodes, stripe-shaped cell mesa regions 230 arranged between and extending along adjacent field plate trenches 230, and stripe-shaped gate trenches 240 formed in the cell mesa region 220 and running parallel to field plate trenches 230.

In an embodiment, contact structures 245 may be provided. For example, the contact structures may be contact grooves extending over at least a part of the active area. The contact grooves may be formed, when seen in plan projection onto the first side 201, over the full spicular trench area and overlapping some distance into the silicon around the spicular trench.

For example, contact grooves or contact trenches 245 are formed in the cell mesa region 220 between the gate trenches 240 and the field plate trenches 230. The contact trenches 245 extend from the first side 201 through source regions 251 and into body regions 252 as shown in FIG. 2A. The contact trenches 245 are less deep than the gate trenches 240 which extend from the first side 201 through the source region 251 and the body region 252 and into the drift region 253 arranged below the body region 252 and between adjacent field plate trenches 230.

As shown in FIG. 2A, the field plate trench 230 extends much deeper into the semiconductor substrate 200 than the gate trench 240. Adjacent field plate trenches 230 thus define and border a cell mesa region 220 which includes at the first side 201 of the semiconductor substrate 200 the source region 251, the body region 252 and a large part of the drift region 253. The field electrodes 231 are typically electrically connected to the source regions 251 and are therefore at source potential. When the semiconductor device is operated in blocking mode, the field electrodes 231 being on source potential contribute to the depletion of the drift region 253 between adjacent field trenches 230. This improves the blocking capabilities of the device and allows to provide the drift region with a higher doping concentration to reduce the on-state resistance $R_{ON}$.

FIG. 2A shows furthermore a drain region 257 at the lower side of FIG. 2A which extends to the second side of the semiconductor substrate 200. An optional field stop region 256 can be formed between the drain region 275 and the drift region 253.

Different to the stripe design illustrated in FIG. 2A, the trench needle design illustrated in FIG. 2B includes a deep trench having a cross-section, when seen in plan projection onto the semiconductor substrate, which has substantially the same width and length. The cross-section can be, for example, square-like, hexagonal, substantially circular, or octagonal. The deep trench includes a central long field electrode surrounded by a field oxide to insulate the field electrode from the surrounding semiconductor substrate. Due to the shape of the (deep) spicular trenches and the field electrode arranged therein being similar to a long needle extending from the first side into the semiconductor substrate, the design may also be referred to as needle trench design.

Instead of having a long stripe-shaped field plate trench, the needle trench design uses a plurality of spicular trenches which can be arranged in lines, when seen in plan projection onto the first side. A single long field trench is thus replaced by a plurality of spicular trenches. Since semiconductor material, i.e. mesa regions, remain between adjacent spicular trenches in long and with direction, both of which are parallel to the main surface of the semiconductor substrate, the total "mesa" area is larger in the needle trench design than in the stripe design leading to a reduction of the on-state resistance $R_{ON}$.

FIG. 2B illustrates a quadrant or quarter of a complete transistor cell according to an embodiment when seen in plan projection onto the first side 101 of the semiconductor substrate 100. Similar to FIG. 2A, the semiconductor substrate 100 includes a first side 101 and a second side 102 arranged opposite the first side 101.

According to an embodiment, the semiconductor substrate 100 can comprise any semiconductor material suitable for manufacturing semiconductor devices. An example for a suitable semiconductor material is silicon.

A spicular trench 130 vertically extends from the first side 101 through a source region 151 and a body region 152 deeply into the drift region 153. The spicular trench 130 may stop short before an optional field stop region 156 formed between the drift region 153 and a drain region 157. A lower end of the spicular trench 130 may also vertically be spaced from the field stop region 156 or may also partially extend into the field stop region 156.

The spicular trench 130 includes a field electrode, which is referred to as needle electrode 131 and which is in the embodiment shown in FIG. 2B a long and vertically extending conductive structure. The needle electrode 131 is electrically insulated from the surrounding semiconductor substrate 100 by a comparably thick field oxide 132. The needle electrodes 131 are typically at source potential to improve depletion of the upper or main part of the drift region 153. Again, this allows raising the doping concentration of the drift region 153 which is beneficial for the on-state resistance $R_{ON}$.

The source region 151, the drift region 153, the optional field stop region 156, and the drain region 157 are of a first conductivity type which is typically n-type. Different thereto, the body region 252 is of a second conductivity type which is typically p-type. The semiconductor devices as described herein are, however, not limited thereto, and the first conductivity type can also be p-type while the second conductivity type can be n-type.

When the drain region 157 is of the first conductivity type, the semiconductor device is a MOSFET having a compensation structure formed by the spicular trenches. When the "drain" region is of the second conductivity type, the semiconductor device is an IGBT. In this case, the region 157 is referred to as emitter region.

According to an embodiment, the source region 151 and the drain region 157 are highly n-doped regions while the drift region 153 is a weakly n-doped region. The field stop region 156 has a doping concentration between the doping concentration of the drift region 153 and the doping concentration of the drain region 157. The dashed lines in FIG. 2B illustrate the increasing doping concentration in the field stop region 156 from the drift region 153 to the drain region 157.

Different to the stripe design, the cell mesa region 120 of a field trench transistor completely surrounds the spicular trench 130 when seen in plan projection onto the first side 101. A full transistor cell is obtained when the illustration in FIG. 2B is rotated around a vertical axis A3 in steps of 90° as FIG. 2B illustrates only a quadrant or quarter.

A contact structure 145 may be provided as described above, for example as a contact groove or a contact trench without being limited thereto.

The trench needle design thus allows to enlarge the cross-sectional area, when seen in plan projection onto the first side 101, of the cell mesa region 120 per unit cell. In addition to that, the length of the gate trench 140 in each of the unit cells can also be increased in comparison to the stripe design so that the effective length of the channel region can be increased.

Figure 11A:
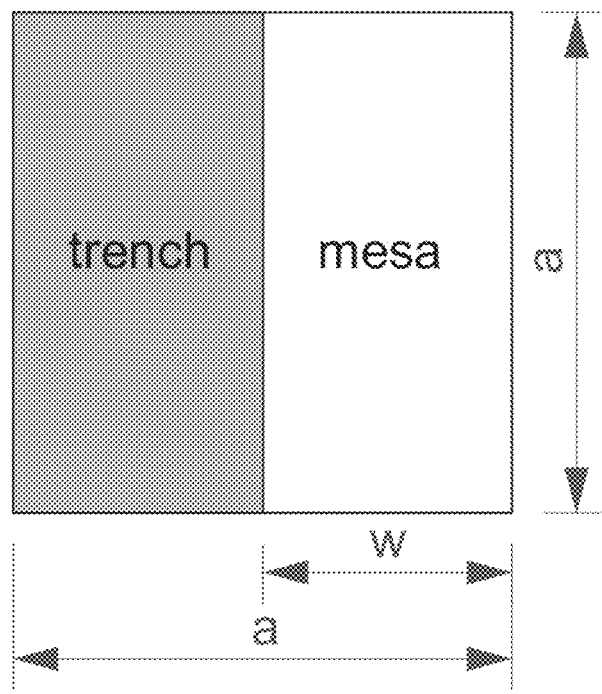
FIGS. 11A and 11B illustrates unit cells of a stripe design and a needle trench design.
Figure 11B:
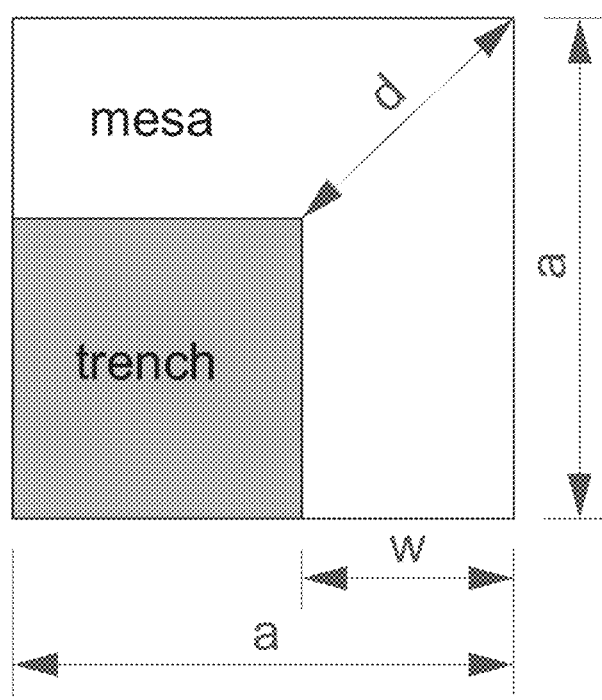

When referring back to FIGS. 11A and 11B, the gate trench in the stripe design would run along the longitudinal extension of the cell mesa region, i.e. in the vertical direction of FIG. 11A, and would therefore have a length a per unit cell. Different thereto, the gate trench surrounds the spicular trench 130 in the needle trench design, which is illustrated in FIG. 11B in the left lower corner. Depending on the specific location of the gate trench in the cell mesa region, the gate trench can have a length of up to 2·a. Therefore, the channel length per unit cell area can be much larger in the needle trench design relative to the stripe design. This further reduces the on-state resistance $R_{ON}$.

Figure 3:
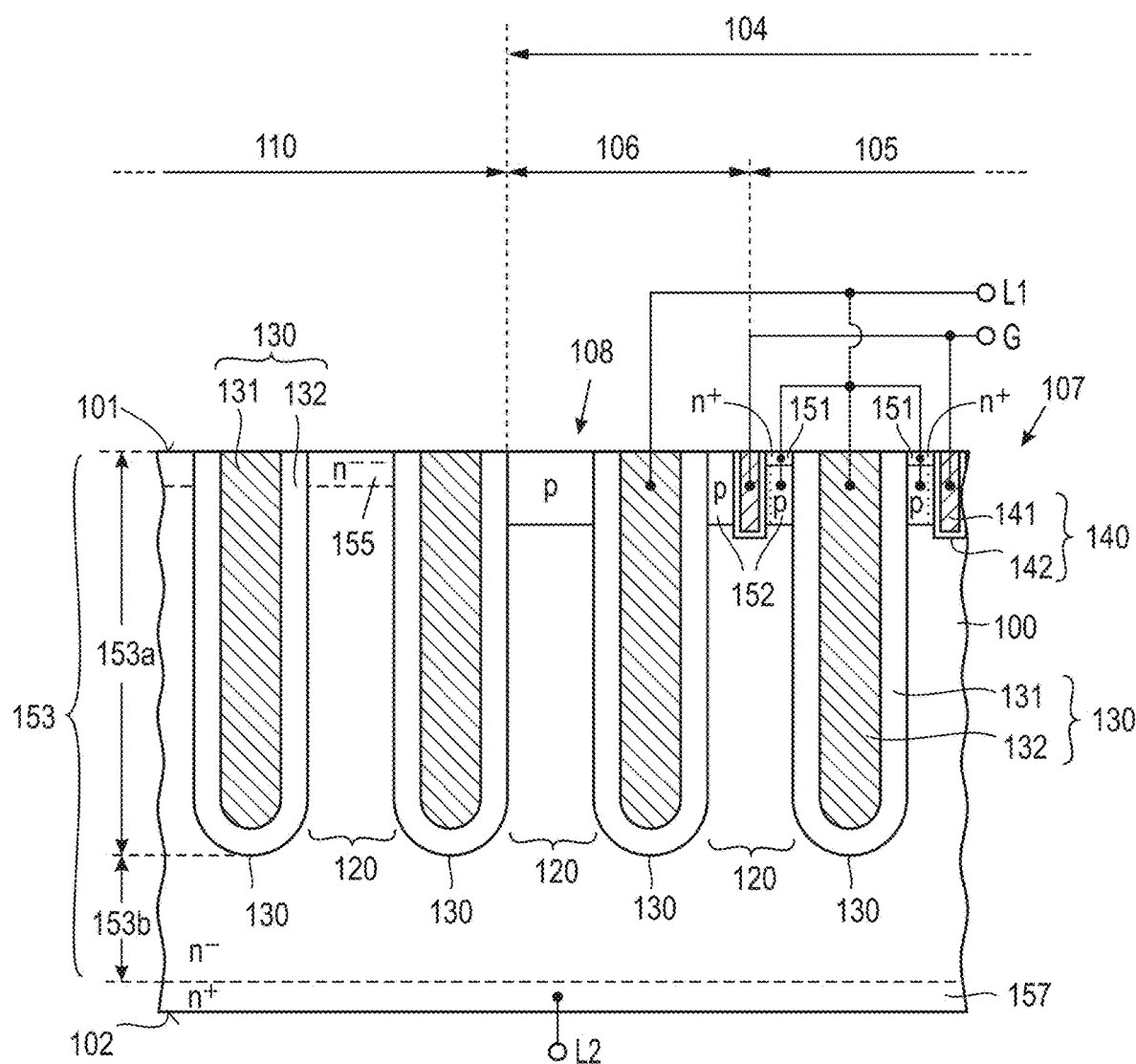
FIG. 3 illustrates a vertical cross-section view through a portion of a semiconductor device having an active area and an edge termination area.

FIG. 3 illustrates a vertical cross-section through a portion of the semiconductor device according to an embodiment. The vertical cross-section shown in FIG. 3 contains portion of the active cell area 105, of the transition area 106 and of the edge termination area 110. As illustrated in FIG. 3, spicular trenches 130 can be formed in any of the active cell area 105, the transition area 106, and the edge termination area 110. For example, the spicular trenches 130 can be formed at a given pattern throughout the semiconductor substrate 100. Typically, the spicular trenches 130 are arranged with the same pattern in the active cell area 105, the transition area 106 and the edge termination area 110. It would, however, also be possible to arrange the spicular trenches 130 with different patterns in, for example, the active area 104 and the edge termination area 110.

As further shown in FIG. 3, each of the spicular trenches 130 includes a needle-shaped field electrode 131, referred to as needle electrode, which is electrically insulated from the surrounding semiconductor substrate 100 by a thick field oxide 132. The spicular trenches 130 extent from the first side 101 deeply into the semiconductor substrate 100 without reaching the drain region 157 formed at the second side 102 of the semiconductor substrate 100. As described further above, the drain region is a highly-doped region which is illustrated here by "n+". The drift region 153 is a weakly n-doped region which is illustrated here by "n−". The doping concentration of the drift region 153 is typically defined by the background doping of the semiconductor substrate 100 which can either be a bulk semiconductor substrate 100 formed by cutting off a slice from an ingot, or an epitaxial layer formed on a base semiconductor substrate 100. Typically, the semiconductor substrate 100 includes an epitaxial layer as this would allow to tailor the doping concentration of the epitaxial layer during growth. The base semiconductor substrate 100 can later form the drain region 157, or can be removed.

An active transistor cell 107 additionally includes a body region 152 which forms a first pn-junction with the drift region 153. The source region 151 is formed at the first side 101 of the semiconductor substrate 100 and forms a second pn-junction with the body region 152. The first pn-junction between the body region 152 and the drift region 153 is the main pn-junction while the second pn-junction between the body region 152 and the source region 151 is typically short-circuited by a body contact. The source region 151 is a highly n-doped region indicated in FIG. 3 by "n+". The body region 152 is a p-doped region as indicated in FIG. 3 by "p".

As shown in FIG. 3, the spicular trenches 130 extend much deeper into the semiconductor substrate 100 than the body region 152. Therefore, the cell mesa region 120 between adjacent spicular trenches 130 is a narrow region which can be easily depleted by supplying a source potential to the needle electrodes 131.

The spicular trenches 130 in the active area 104 have a lower end pointing to the second side 102 of the semiconductor substrate 100. The lower end of the spicular trenches 130 define a level within the semiconductor substrate 100 which is substantially parallel to the first side 101 and the second side 102. The drift region 153 can be considered to include an upper drift region 153a and a lower drift region 153b. The upper drift region 153a extends from the level defined by the lower ends of the trenches 130 in the active area 104 toward the first side 101. The lower drift region 153b extends from the level defined by the lower ends of the spicular trenches 130 in the active area 104 toward the second side 102. The upper drift region 153a may also referred to as cell mesa region 120 when arranged between adjacent spicular trenches 130.

According to an embodiment, the upper drift region 153a and the lower drift region 153b may have the same doping concentration. According to an embodiment, the upper drift region 153a and the lower drift region 153b may have different doping concentrations.

A gate trench 140 is arranged in the cell mesa region 120 formed by the upper drift region 153a between adjacent spicular trenches 130. The gate trench 140 extends from the first side 101 through the source region 151 and the body region 152 into the drift region 153. As seen in the cross-sectional view of FIG. 3, the spicular trenches 130 are much deeper than the respective gate trenches 140, which merely extend slightly deeper into the semiconductor substrate 100 than a lower end of the body region 152. The lower end of the gate trenches 140 are therefore slightly below the first pn-junction between the drift region 153 and the body region 152. The gate trench 140 may form, when seen in plan projection onto the first side 101, a net or a grid of crossing gate trenches. When seen in a vertical cross-sectional view as in FIG. 3, the gate trenches 140 may appear to be separated although they are connected with each other at gate crossing regions.

Each gate trench 140 includes a gate electrode 141 which is electrically insulated from the surrounding semiconductor substrate 100 by a gate dielectric 142. The gate dielectric 142 is typically much thinner than the field oxide 131 of the spicular trench 130, because the gate dielectric 142 needs to tolerate only moderate voltages such as 5 V to 15 V. Different thereto, the field oxide 131 needs to withstand much higher voltages, such as 50 V to 250 V or above, particularly in the region at the bottom of the spicular trenches 130.

The needle electrodes 132, the source regions 151 and the body regions 152 are electrically connected to a source metallization which is schematically shown in FIG. 3 as being connected with a terminal L1. Thus, the same voltage, or electrical potential, is applied to the source regions 151, the body regions 152 and the needle electrodes 132. The gate electrodes 141 are electrically connected to a gate terminal G.

FIG. 3 illustrates that only the field electrodes 131 in the active area 104 are electrically connected to the source metallization. The field electrodes 131 in the edge termination area 110 are illustrated as electrically disconnected from the source metallization. Each of the field electrodes 131 in the edge termination area 110 can be, for example, electrically connected to a floating p-region formed in the edge termination area 110 at the first side 101 of the semiconductor substrate 100. Another option is to electrically connect the field electrodes 131 in the edge termination area 110 to the source metallization so that all field electrodes 131 in the active area 104 and in the edge termination area 110 are at source potential. It would also be possible to electrically connect only a portion of the field electrodes 131 in the edge termination area 110 with a source metallization while other field electrodes 131 in the edge termination area 110 are electrically insulated from the source metallization.

FIG. 3 also illustrates a structural difference between an active transistor cells and an inactive transistor cell. An active transistor cell is capable of forming and controlling a conductive channel region extending from the source region 151 through the body region 152 to the drift region 153 along the gate dielectric 142 of the gate trenches 140. The conductive channel region is formed under the influence of the electrical field generated by applying a gate voltage above a given threshold to the gate electrodes 141. The dotted vertical line in the body regions 152 next to the gate trenches 140 illustrates the conductive channel region.

If any of source region 151, body region or gate electrode 141 is missing, the transistor cell is not capable of providing a controllable conductive channel region between the source region 151 and the drain region 157 through the body region 152.

Therefore, an inactive transistor cell may have substantially the same structure as an active transistor cell but does not include, for example, a source region or a gate electrode. In addition to that, an active transistor cell which otherwise includes all required structural elements such as source region, body region, drift region and gate electrode can be rendered inactive or inoperable when either the source region or the gate electrode is electrically disconnected from the source metallization and the gate terminal, respectively.

The transition region 106 shown in FIG. 3 may include inactive transistor cells 108 which do not include a source region and the gate electrode. The inactive transistor cells 108 do not contribute to the current through the semiconductor device. The main function of the inactive transistor cells 108 is to maintain a desired distribution of the electrical field within the semiconductor substrate 100 when the device is operated in blocking mode and to provide an "electrical transition" between the active area 104 and the edge termination area 110.

According to an embodiment, a surface doping region 155 is formed in the edge termination area 110 at the first side 101 of the semiconductor substrate 100. The surface doping region 155 is a weakly n-doped region having a lower doping concentration than the upper drift region 153a of the drift region 153. The upper drift region 153a of the drift region 153 may have the background doping of the semiconductor substrate 100. The surface doping region 155 having a lower doping concentration than the upper drift region 153a of the drift region 153 can be described as a shallow doping region which is only formed close to the first side 101 of the semiconductor substrate 100.

According to an embodiment, the surface doping region 155 can vertically extend less deep than the body regions 152. According to a further embodiment, the surface doping region 155 can vertically extend deeper than the body regions 152.

In view thereof, a semiconductor device includes a semiconductor substrate 100 having a first side 101, a second side 102 opposite to the first side 101, and a lateral rim 103. A drift region 153 of a first conductivity type is formed in the semiconductor substrate 100. The drift region 153 includes a surface doping region 155 with a net doping concentration lower than a net doping concentration of an upper drift region 153a of the drift region 153. An active area 104 includes a body region 152 of a second conductivity type and a plurality of spicular trenches 130 extending from the first side 101 through the body region 152 and into the drift region 153. An edge termination area 110 is arranged between the active area 104 and the lateral rim 103 of the semiconductor substrate 100 and includes a plurality of termination trenches 130 extending from the first side 101 into the upper drift region 153a. The body region 152 may extend deeper into the semiconductor substrate 100 than the surface doping region 155 of the drift region 153. Alternatively, the surface doping region 155 may extend deeper into the semiconductor substrate 100 than the body region 152.

A surface doping region 155 extending less deep than the body region 152 may be more effective since the weakness of the edge termination comes partly from the high electric field at the p-body junction end.

According to an embodiment, the surface doping region 155 is formed only in the edge termination area 110 and not in the active area 104. This avoids that the reduced net doping concentration of the surface doping region 155 influences the characteristics of the transistor cells formed in the active area 104.

According to an embodiment, the plurality of termination trenches comprises a plurality of spicular trenches 130 in the edge termination area 110 extending from the first side 101 into the upper drift region 153a of the drift region 153.

According to an embodiment, the net doping concentration, or average net doping concentration, of the surface doping region 155 is lower than 80% of the net doping concentration, or average net doping concentration, of the upper drift region 153a in the cell mesa regions of the active area 104, particularly lower than 50% such as lower than 20%. According to an exemplary embodiment, the net doping concentration of the upper drift region 153a is at least $1 \cdot 10^{16}/cm^3$, particularly at least $1.5 \cdot 10^{16}/cm^3$, and more particularly at least $2 \cdot 10^{16}/cm^3$. Different thereto, the net doping concentration of the surface doping region 155 can be equal to or lower than $1 \cdot 10^{16}/cm^3$, according to an embodiment. In further embodiments, the net doping concentration of the surface doping region 155 is equal to or lower than $8 \cdot 10^{15}/cm^3$, particularly equal to or lower than $6 \cdot 10^{15}/cm^3$, and more particularly equal to or lower than $3 \cdot 10^{15}/cm^3$.

The weakly doped surface doping region 155 laterally relaxes the distribution of the electrical field in the edge termination area 110 and thus contributes to the blocking capabilities of the electronic device in the edge termination area 110.

The effect of the weakly doped surface doping region 155 is described with reference to FIGS. 4A, 4B, 5A, and 5B. All of these Figures illustrate an edge termination area 110 of a semiconductor device of a needle trench design having a plurality of spicular trenches arranged in the edge termination area 110. The rightmost spicular trench in the Figures represents the most outer active transistor cell. The lateral rim 103 of the semiconductor substrate 100 would be on the left side of the respective Figure.

For a semiconductor device having a stable and reliable breakdown characteristics the location of the avalanche generation during breakdown should be within the active area 104 of the semiconductor substrate 100 at the lower end of the spicular trenches 130, i.e. at the trench bottom. The active area 104 is typically larger and therefore more stable and robust than the edge termination area 110 which includes the outer rim 103. It is therefore desirable that an avalanche breakdown occurs in a region of the semiconductor device which can tolerate a breakdown. Such a robust region is, for example, at the lower end of the spicular trenches 130. This region is also capable of tolerating repetitive avalanche breakdowns which may occur during operation of the semiconductor device. Many power semiconductor devices need to tolerate such avalanche breakdowns which can frequently occur during operation.

Due to further optimization of the semiconductor devices towards lower on-state resistance $R_{ON}$ the net doping concentration of the drift region 153 of modern devices is increased. Simulations revealed that the breakdown location in case of a higher doping concentration of the drift region 153 may move to the end of the last spicular trench in the edge termination area as shown in FIG. 4A. FIG. 4A illustrates the distribution of the electrical field strength under blocking conditions, i.e. when no conductive channel is formed and a high voltage difference appears between source region and drain region. The large voltage drop between source region and drain region must be accommodated by the drift region. The electrical field strength occurring in the drift region can be large.

The simulation of the distribution of the electrical field strength in FIG. 4A shows that high field strength appears along the last spicular trench which is the leftmost spicular trench in FIGS. 4A and 4B. FIG. 4B illustrates the distribution of the electrostatic potential under blocking condition. The distribution of the electrostatic potential in FIG. 4B indicates that the potential changes vary rapidly at the outer region of the last spicular trench, resulting in high electric field strength. To improve the blocking capability of the edge termination area, it is desired to relax the electrostatic potential distribution at the end of the termination structure.

According to an embodiment, when providing the drift region 153 with a shallow weakly doped surface doping region 155, the distribution of the electrostatic potential can be laterally spread and strong electrical fields prevented at the outer spicular trench in the edge termination area 110.

According to an embodiment, the net doping concentration of the surface doping region 155, as of other doping regions, may vary to a given degree. However, the average net doping concentration of the surface doping region 155 is lower than the average net doping concentration of the upper drift region 153a.

For example, the drift region 153, when formed by epitaxial deposition, can be provided with a graded surface doping region 155 towards the first side 101 by reducing the net doping concentration during epitaxial growth. When referring to the net doping concentration, the absolute value of the difference between the n-doping concentration and p-doping concentration is meant as the net doping concentration basically defines the conductivity type and conductivity of the respective doping region.

The surface doping region 155 having a reduced net doping concentration is typically formed only at the first side 101 and does not extend deep into the semiconductor substrate 100. According to an embodiment, an nn-junction or interface between the upper drift region 153a and the surface doping region 155 is vertically above the first pn-junction between the body region 152 and the drift region 153. The upper drift region 153a of the drift region 153 therefore vertically extends above the first pn-junction, so that the first pn-junction can be described to be formed between the upper drift region 153a and the body region 153.

The surface doping region 155 may be less deep than the body region 152. The reduction of the net doping concentration therefore does not appear in the cell mesa region 120 between the spicular trenches 130 in the active area 104. The reduction of the surface doping in the drift region 153 thus does not affect the doping relations within the upper drift region 153a, or the cell mesa regions 120, in the active area 104.

According to a practical embodiment, the surface doping region 155 of the drift region 153 extends, from the first side 101, to a depth of equal to or less than 1 μm, for example less than 500 nm. The body regions 152 may extend to a different depth into the semiconductor substrate 100, for example, may extend deeper than the surface doping region.

According to an embodiment, the surface doping region 155 is formed by implanting counter dopants into the upper drift region 153a. The drift region 153 may be formed by epitaxial deposition to form the upper drift region 153a with a substantially homogeneous doping concentration. In a later process, counter dopants may be implanted globally, or in selected areas using an implantation mask, to reduce the net-doping concentration at the first side 101 and to form the surface doping region 155 having a lower net-doping concentration than the upper drift region 153a.

Both the upper drift region 153a and the surface doping region 155 may be of the first conductivity type and have the same doping concentration of dopants of the first conductivity type. The surface doping region 155 may have also dopants of the second conductivity type which effectively reduces the net doping concentration of the surface doping region 155. Since the doping concentration of the dopants of the first conductivity type is higher than the doping concentration of the dopants of the second conductivity type in the surface doping region 155, the "net" conductivity type of the surface doping region 155 remains of the first conductivity type.

According to an embodiment, the upper drift region 153a in the cell mesa regions 120 of the active area 104 does not contain a counter doping while the surface doping region 155 formed in the edge termination area 110 includes a counter doping to reduce the net doping concentration relative to the net doping concentration of the upper drift region 153a in the cell mesa regions 120 of the active area 104.

Figure 5A:
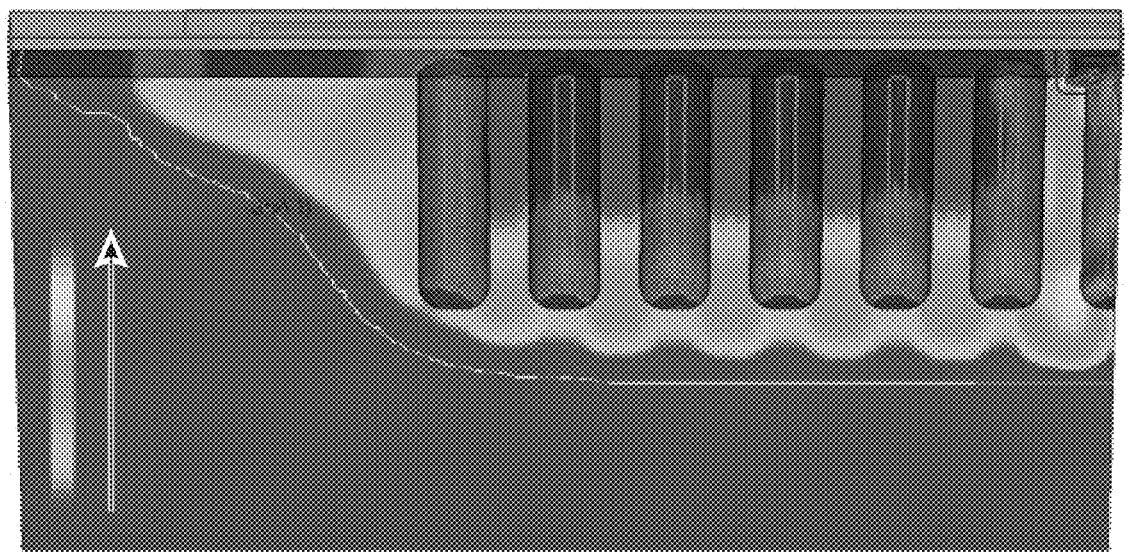
FIGS. 5A and 5B illustrate the distribution of the impact ionization and the electrostatic potential in an edge termination area of a semiconductor device which has a surface doping region according to an embodiment.
Figure 5B:
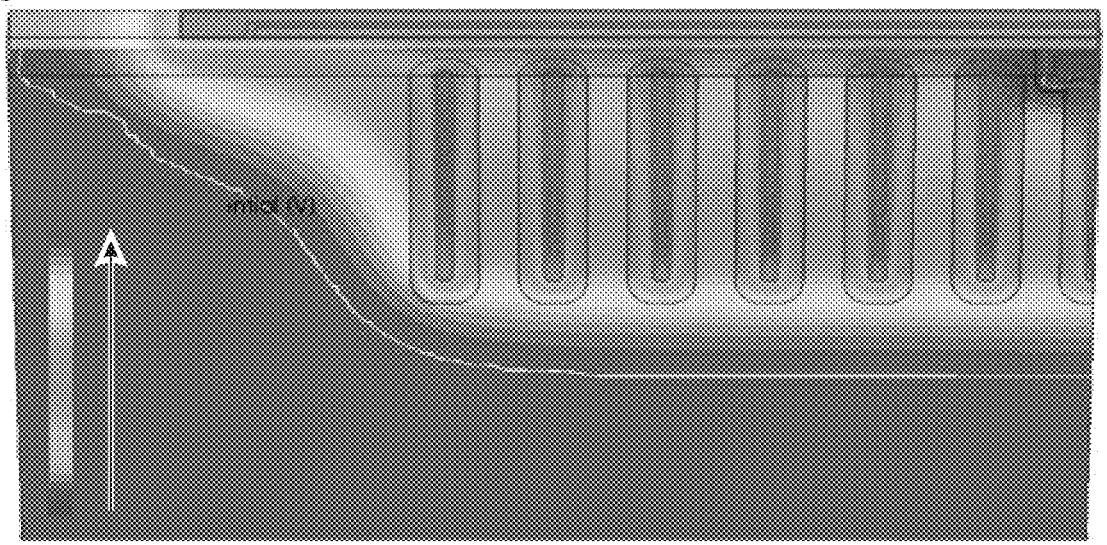

For evaluating the effect of the surface doping region 155, reference is made to FIGS. 5A and 5B. FIG. 5B illustrates the distribution of the electrostatic potential of a semiconductor device having a surface doping region 155 with a reduced net doping concentration relative to the net doping concentration of the upper drift region 153a of the drift region 153. As shown in FIG. 5B, the electrostatic potential is significantly spread toward the outer rim (left side of FIG. 5B) which means that the electric field close to the outer spicular trench, i.e. the leftmost spicular trench, is reduced. This is confirmed by FIG. 5A which shows the location of avalanche generation, which may be expressed by the impact ionisation in $cm^{-3} \cdot s^{-1}$. The risk for an avalanche breakdown is significantly reduced in the region of the last spicular trench and maybe even lower than close to the active area 104 which begins at the rightmost spicular trench in FIG. 5B.

FIG. 6 illustrates the results of a further simulation to evaluate the influence on the net-doping concentration of the upper drift region 153a. The net-doping concentration is referred to as Nepi in FIG. 6. Curve 301 represents the dependency of the breakdown voltage BV in the active area 104 from the net doping concentration. Curve 302 represents the dependency of BV in the edge termination area 110 when no surface doping region is formed. Curve 303 represents the dependency of BV in the edge termination area 110 when a surface doping region is formed. FIG. 6 reveals that the breakdown voltage BV remains substantially high in the active area 104 even at a high doping concentration of the upper drift region 153a. Different thereto, an increase of the doping concentration at the first side 101, i.e. when no surface doping region with reduced net-doping concentration is formed, leads to a significant reduction of the breakdown voltage in the edge termination area 110. This is illustrated by curve 302. When reducing the doping concentration at the first side 101 by providing a surface doping region of reduced doping concentration, the drop of BV can be significantly reduced as illustrated by curve 303.

Figure 7:
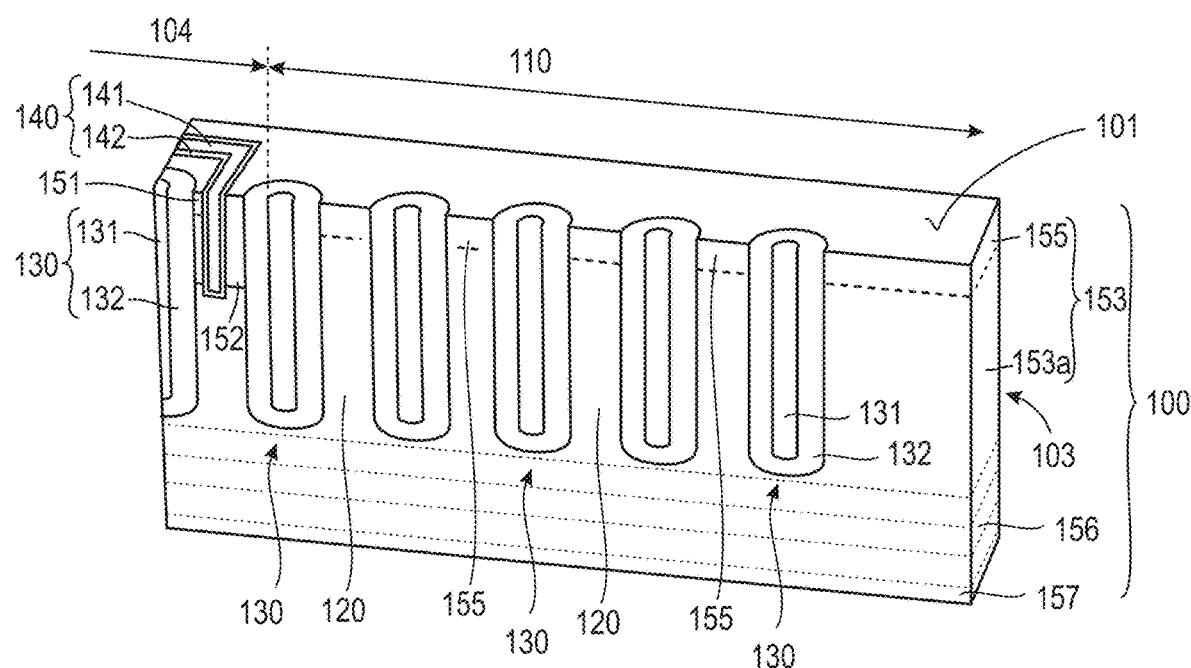
FIG. 7 illustrates a section of an edge termination area of a semiconductor substrate according to an embodiment.

FIG. 7 illustrates the edge termination area 110 according to an embodiment. The edge termination area 110 includes a plurality of spicular trenches 130 each having a needle electrode 131 electrically insulated from the semiconductor substrate 100 by a comparably thick field oxide 132. The field oxide 132 can be a thermally grown silicon oxide. Further options include a layer stack of several insulating layers such as nitride layers and oxide layers. According to an embodiment, the field electrode trenches 130 in the edge termination area 110 have the same structure as the field electrode trenches 130 in the active area 104. All field electrode trenches 130 including the field oxide 132 and the needle electrodes 131 are commonly formed.

FIG. 7 illustrates a small portion of the active area 104 in the left part of the Figure. The leftmost spicular trench 130, which is a spicular trench 130 formed in the active area 104, is shown to be completely surrounded by a gate trench 140. For sake of simplicity, a contact trench is not illustrated in FIG. 7. The body region 152 is illustrated in FIG. 7 to extend only within the active area 104. Body and source regions are not formed in the edge termination area 110. However, a body region 152 can also be at least partially formed in the edge termination area 110 between selected spicular trenches 130.

FIG. 7 further illustrates the drift region 153 which includes an upper drift region 153a and a surface doping region 155 which is formed at the first side 101 of the semiconductor substrate 100. The surface doping region 155 laterally completely extend from the outer end of the active area 104 to the lateral rim 103 of the semiconductor substrate 100. According to an embodiment, the surface doping region 155 is only formed in an outer part of the edge termination area 110 extending to the lateral rim 103 while the upper drift region 153a is formed to extend to the first side 101 in an inner part of the edge termination area 110 next to the active area 104.

In addition to improving the avalanche breakdown robustness of the edge termination area, the surface doping region 155 with reduced net doping concentration also helps to reduce the electric field at the lateral end of the body region, where the electric field can also be critical.

A further improvement for the electrical field relaxation in the edge termination area 110 is to place a so-called source runner and/or a so-called gate runner above the critical region at the end of the edge termination area. Each of these runners are at comparably low voltage or at 0 V during blocking mode. These electrical structures push the electrical field lines further away from the most outer trench leading to a further reduction of the electrical field strength. Embodiments with gate runners and source runners are illustrated in FIGS. 8A and 8B.

Figure 8A:
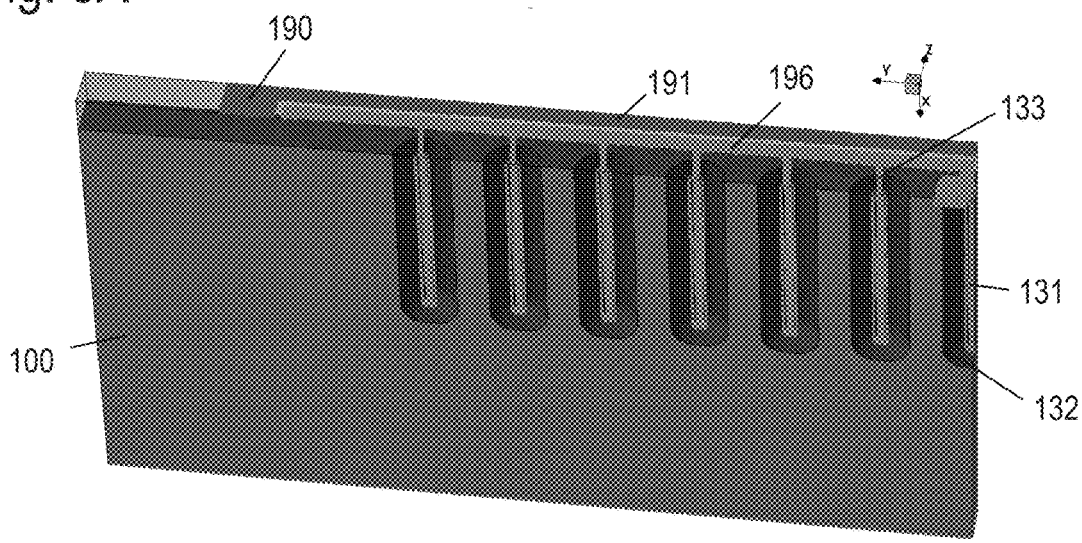
FIGS. 8A and 8B illustrate sections of an edge termination area of a semiconductor substrate according to an embodiment.

FIG. 8A illustrates a vertical cross-section through the semiconductor substrate 100 showing a plurality of spicular trenches 130 each having a needle electrode 131 and a field oxide 132. The needle electrode 133 is electrically connected to a source contact line 195 by respective needle contact 133.

Figure 8B:
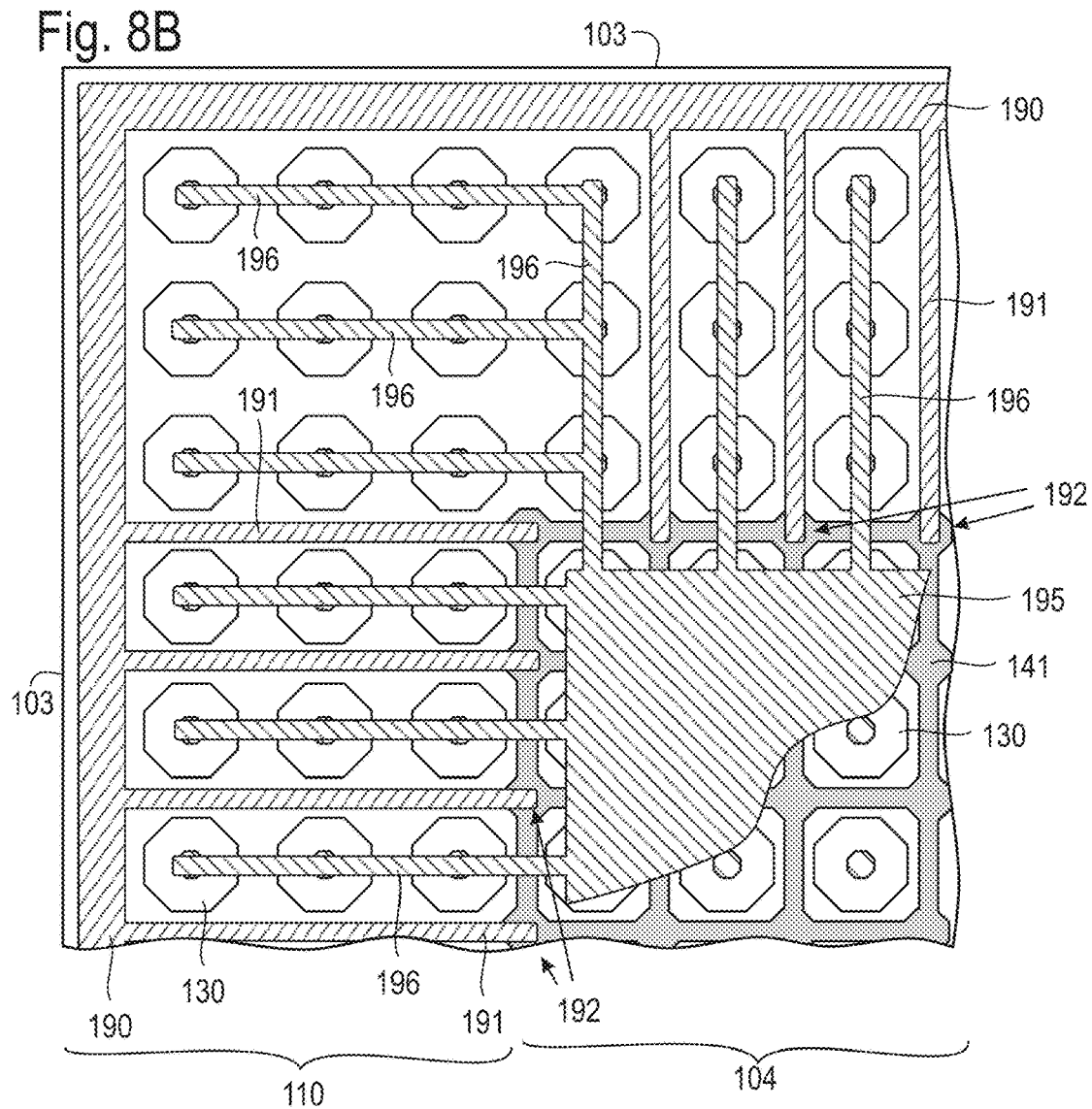

FIG. 8B illustrates a plan view onto the first side 101 of the semiconductor substrate 100. A large source metallization 195 is formed in the active area 104 and basically completely covers the active area 104 when seen in plan projection onto the first side 101. For illustration purposes only, the source metallization 195 is partially removed to show the spicular trenches 130 and the gate electrodes 141 in the active area 104. The source contact lines 196 laterally extend from the source metallization 195 to provide an ohmic connection for all, or selected, needle electrodes in the edge termination area 110.

Along an outer region of the semiconductor substrate 100 between the most outer spicular trenches 130 and the lateral rim 103, a gate runner 190 is formed. Gate contact lines 191, which may also be referred to as gate fingers, laterally extend from the gate runner 190 to be in ohmic connection with the gate electrodes 141 at gate contacts 192.

The gate runner 190, the gate contact lines 191, the source metallization 195, and the source contact lines 196 are all structures formed in the same level above the first side 101 of the semiconductor substrate 100. Typically, these structures are formed by structuring a metal layer which is deposited onto an insulation layer. The insulation layer is then arranged between the first side 101 of the semiconductor substrate 100 and the source metallization 195, the source contact lines 196, the gate runner 190, and the gate contact lines 191. The needle contacts 133, best shown in FIG. 8A, and the gate contacts 192 vertically extend through the insulation layer.

The gate runner 190, being at a comparably low electrostatic potential in blocking mode, further supports the lateral spreading of the electrical field which further improves the breakdown characteristics of the semiconductor device. Although FIG. 8B illustrates only a gate runner 190 along the edge termination are 110, other embodiments may include a gate runner and a source runner, or only a source runner. Since a source runner is also at low electrostatic potential in breakdown mode, providing a source runner in the edge termination area 110 is also beneficial.

According to an embodiment, the gate runner and/or the source runner are provided to at least partially cover a region between the most outer trench and the lateral rim 103.

FIGS. 9A and 9B give some examples for suitable patterns to arrange the spicular trenches 130 and for the cross-sectional shape of the transistor cells when seen in plan projection onto the first side 101. FIG. 9B illustrates in the lower portion an example for a spicular trench having a square like cross-sectional area. The upper portion of FIG. 9B illustrates a spicular trench having a hexagonal cross-sectional area. When using spicular trenches having a hexagonal cross-sectional area, a staggered pattern, e.g. a non-orthogonal regular pattern, of the transistor cells can be formed as illustrated in FIG. 9A. Different thereto, when using spicular trenches having a square like cross-sectional area, the transistor cells can be arranged on a regular pattern as illustrated in FIG. 9C. An arrangement in a regular pattern, i.e. in columns and stripes, is also possible with spicular trenches having a hexagonal cross-sectional area while spicular trenches with a square-like cross-sectional shape can also be arranged in a staggered pattern.

Depending on the actual design of the spicular trenches, when seen in plan projection onto the first side 101, the gate trenches 140, or gate electrodes 141, may form gate crossings 143 having a different layout. FIG. 9A illustrates a hexagonal shape of the spicular trenches. The region, were to crossing gate trenches 140 meet, is a gate crossing 143. In the embodiment of FIG. 9A, the respective gate crossing 143 is between three adjacent spicular trenches and has a triangular shape. In FIG. 9C having a square-like cross-sectional shape of the spicular trenches, the respective gate crossing 143 is between four adjacent spicular trenches and has a square-like shape.

Figure 10:
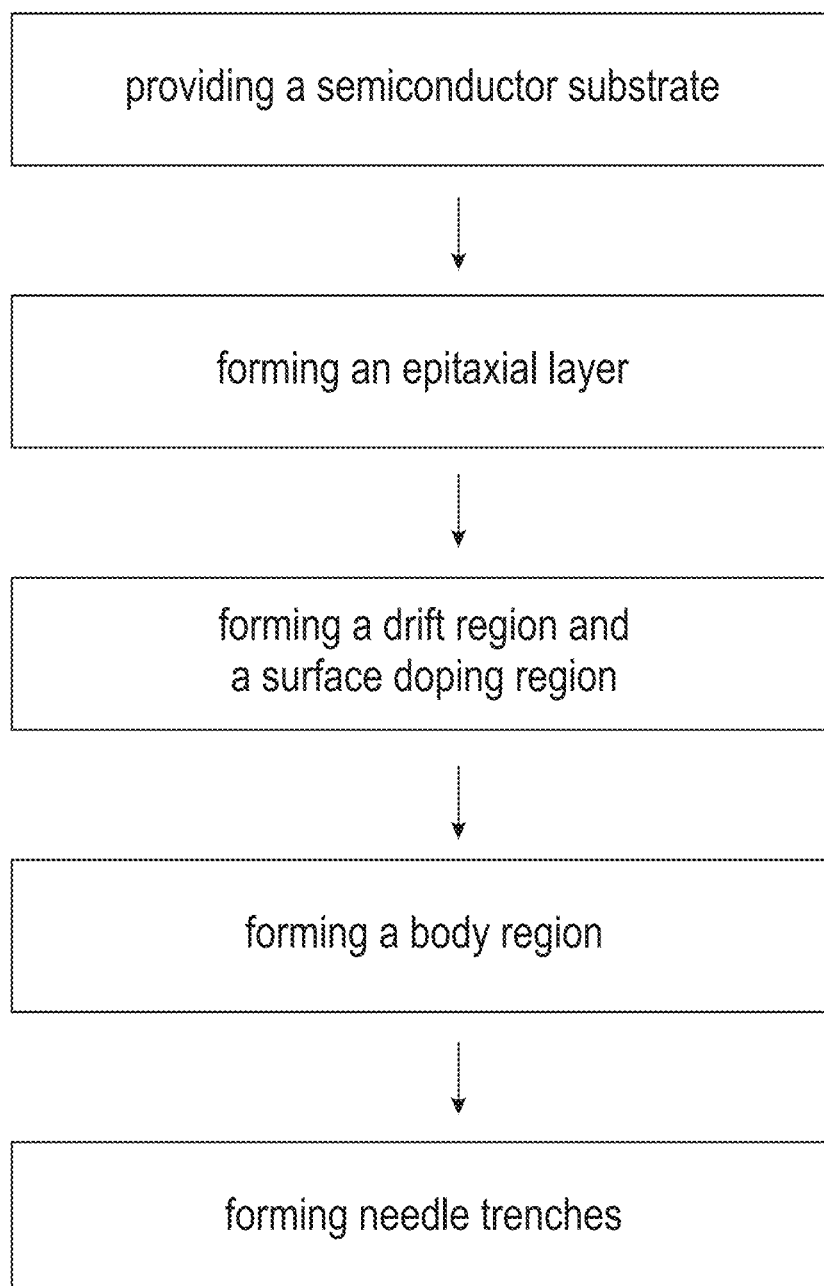
FIG. 10 illustrate processes for manufacturing a semiconductor device according to an embodiment.

With reference to FIG. 10, a method for manufacturing a semiconductor device according to an embodiment is explained. The method may include providing a semiconductor base substrate and forming an epitaxial layer on the semiconductor base substrate, wherein the epitaxial layer and the semiconductor base substrate form together a semiconductor substrate. A drift region 153 is formed comprising a surface doping region 155 of a first conductivity type and an upper drift region 153a of the first conductivity type in the epitaxial layer. The surface doping region 155 has a net doping concentration lower than a net doping concentration of the upper drift region 153a. A body region 152 of a second conductivity type may be formed in an active area 104. Furthermore, a plurality of spicular trenches 130 extending from the first side 101 through the body region 152 and into the drift region 153 are formed in the active area 104. A plurality of termination trenches 130 extending from the first side 101 into the upper drift region 153a are formed in the edge termination area 110.

According to an embodiment, the body region 152 is formed to extend deeper into the semiconductor substrate 100 than the surface doping region 155. According to an alternative embodiment, the surface doping region 155 is formed to extend deeper into the semiconductor substrate 100 than the body region 152.

The semiconductor base substrate can be a bulk material obtained by cutting a slice from an ingot. The epitaxial layer may later include all doping regions such as the drain region 151, the body region 152, the drift region 153, the field stop region 156 and the drain region 157. The semiconductor base substrate can be finally removed or used as drain region 157.

The doping concentration of the upper rift region 153a and of the surface doping region 155 of the drift region 153 can be adjusted during epitaxial growth. Alternatively, the drift region 153 is formed with a homogeneous doping concentration and the surface doping region 153 is subsequently formed by a counter implantation.

The net doping concentration of the upper drift region 153a can be at least $1 \cdot 10^{15}/cm^3$, typically at least $1 \cdot 10^{16}/cm^3$ according to some embodiments.

According to an embodiment, the surface doping region 155 is formed such to have a net doping concentration of 80% or less than the net doping concentration of the upper drift region 153 in the cell mesa region 120 of the active area 104.

The net doping concentration of the surface doping region 155 can be equal to or lower than $1 \cdot 10^{16}/cm^3$, typically equal to or lower than $8 \cdot 10^{15}/cm^3$, particularly equal to or lower than $6 \cdot 10^{15}/cm^3$, for example depending on the net doping concentration of the upper drift region as already exemplarily explained above.

According to an embodiment, source regions 151 of the first conductivity type are formed in the active area 104.

According to an embodiment, gate trenches 140 are formed in the active area 104 adjacent to respective spicular trenches 130, wherein the gate trenches 140 extend from the first side 101 through the body region 152. Each of the gate trenches 140 has a gate electrode 141 electrically insulated from the adjacent body region 152, wherein the spicular trenches 130 extends deeper into the semiconductor substrate 100 than the gate trenches 140.

According to an embodiment, the drift region may be formed by supplying a doping gas during formation of the epitaxial layer, and reducing the supply of the doping gas to form the surface doping region 155 when the epitaxial layer has reached a predetermined thickness. The grading of the doping concentration can thus be provided during epitaxial growth. This is a cost-efficient approach for reducing the doping concentration at the first side 101 of the semiconductor substrate 100 to form the surface doping region.

According to a further embodiment, the drift region is formed by supplying a doping gas during formation of the epitaxial layer, and stopping the supply of the doping gas to form the surface doping region 155 when the epitaxial layer has reached a predetermined thickness. The upper region of the epitaxial layer is thus initially undoped. Due to thermal processes, dopants diffuse from lower parts of the epitaxial layer to the upper region arranged at the first side 101. The resulting doping profile, in vertical direction, shows a reduction towards the first side 101.

According to a further embodiment, the drift region is formed by supplying a doping gas during formation of the epitaxial layer at a substantially constant supply rate, and after forming the epitaxial layer, by implanting counter dopants into the epitaxial layer to reduce the net doping concentration at a surface of the epitaxial layer to form the surface doping region 155. This approach allows the local formation of the surface doping region without affecting other regions. Furthermore, using of counter dopants provides a better control of the doping concentration to better tailor the net-doping concentration in the surface doping region 155.

For implanting counter dopants, the active area 104 may be covered with a mask to avoid that the counter dopants are implanted into the active area 104. The mask thus leaves only the edge termination area 110, or only an outer part of the edge termination area 110 uncovered.

According to an embodiment, a mask may be formed on the surface of the epitaxial layer to cover the active area and to expose the edge termination area. The mask is used as implantation mask during implantation to avoid that the counter dopants are implanted into the active area.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a semiconductor substrate having a first side, a second side opposite to the first side, a lateral rim, an active area, an edge termination area arranged between the active area and the lateral rim of the semiconductor substrate, a drift region of a first conductivity type and a body region of a second conductivity type, the drift region comprising an upper drift region and a lower drift region,
    wherein the active area comprises at least portions of the body region and a plurality of spicular trenches each comprising a field electrode and extending from the first side through the body region and into the drift region, each of the spicular trenches in the active area comprising a lower end, the lower ends together defining a lower end of the upper drift region extending towards the first side, the lower drift region extending from the lower end of the upper drift region towards the second side, wherein the edge termination area comprises a plurality of termination trenches extending from the first side at least into the upper drift region, wherein the drift region has a surface doping region arranged in the upper drift region in the edge termination area and extending to the first side, wherein the surface doping region is spaced apart from the lower end of the upper drift region and has a net doping concentration lower than a net doping concentration of the upper drift region, wherein the surface doping region has a net conductivity type of the first conductivity type, wherein the surface doping region laterally completely extends from an outer end of the active area to the lateral rim of the semiconductor substrate.

2. The semiconductor device of claim 1, wherein the plurality of termination trenches comprises a plurality of spicular trenches in the edge termination area extending from the first side into the upper drift region.

3. The semiconductor device of claim 1, wherein the net doping concentration of the upper drift region is at least $1 \cdot 10^{15}/cm^3$.

4. The semiconductor device of claim 1, wherein the net doping concentration of the surface doping region is equal to or lower than 80% of the net doping concentration of the upper drift region.

5. The semiconductor device of claim 1, wherein the drift region extends in the edge termination area to the first side.

6. The semiconductor device of claim 1, further comprising gate trenches in the active area adjacent to respective spicular trenches, the gate trenches extending from the first side through the body region, wherein each of the gate trenches comprises a gate electrode electrically insulated from the adjacent body region, wherein the spicular trenches extends deeper into the semiconductor substrate than the gate trenches.

7. The semiconductor device of claim 6, wherein at least some of the spicular trenches in the active area are at least partially laterally surrounded by a respective gate trench.

8. The semiconductor device of claim 1, further comprising at least one of a gate runner and a source runner arranged in the edge termination area.

9. The semiconductor device of claim 1, wherein the spicular trenches are arranged in a staggered pattern.

10. A semiconductor device, comprising:
a semiconductor substrate having a first side, a second side opposite to the first side, a lateral rim, an active area, an edge termination area arranged between the active area and the lateral rim of the semiconductor substrate, a drift region of a first conductivity type and a body region of a second conductivity type, the drift region comprising an upper drift region and a lower drift region; and
counter dopants disposed in the upper drift region in the edge termination area, the counter dopants having an opposite conductivity type as the drift region and reducing a net doping concentration of the upper drift region at the first side of the semiconductor substrate to form a surface doping region in the edge termination area, the surface doping region having a net conductivity type of the first conductivity type, wherein the active area comprises at least portions of the body region and a plurality of spicular trenches each comprising a field electrode and extending from the first side through the body region and into the drift region, each of the spicular trenches in the active area comprising a lower end, the lower ends together defining a lower end of the upper drift region extending towards the first side, the lower drift region extending from the lower end of the upper drift region towards the second side, wherein the edge termination area comprises a plurality of spicular termination trenches extending from the first side at least into the upper drift region, wherein the surface doping region is spaced apart from the lower end of the upper drift region, wherein the surface doping region laterally completely extends from an outer end of the active area to the lateral rim of the semiconductor substrate.

11. A semiconductor device, comprising:
a semiconductor substrate having a first side, a second side opposite to the first side, a lateral rim, an active area, an edge termination area arranged between the active area and the lateral rim of the semiconductor substrate, a drift region of a first conductivity type and a body region of a second conductivity type, the drift region comprising an upper drift region and a lower drift region, wherein the active area comprises at least portions of the body region and a plurality of spicular trenches each comprising a field electrode and extending from the first side through the body region and into the drift region, each of the spicular trenches in the active area comprising a lower end, the lower ends together defining a lower end of the upper drift region extending towards the first side, the lower drift region extending from the lower end of the upper drift region towards the second side, wherein the edge termination area comprises a plurality of termination trenches extending from the first side at least into the upper drift region, wherein the drift region has a surface doping region arranged in the upper drift region in the edge termination area and extending to the first side, wherein the surface doping region is spaced apart from the lower end of the upper drift region and has a net doping concentration lower than a net doping concentration of the upper drift region, wherein the surface doping region has a net conductivity type of the first conductivity type, wherein the surface doping region is only formed in an outer part of the edge termination area extending to the lateral rim, wherein the upper drift region extends to the first side in an inner part of the edge termination area next to the active area.

12. A semiconductor device, comprising:
a semiconductor substrate having a first side, a second side opposite to the first side, a lateral rim, an active area, an edge termination area arranged between the active area and the lateral rim of the semiconductor substrate, a drift region of a first conductivity type and a body region of a second conductivity type, the drift region comprising an upper drift region and a lower drift region; and
counter dopants disposed in the upper drift region in the edge termination area, the counter dopants having an opposite conductivity type as the drift region and reducing a net doping concentration of the upper drift region at the first side of the semiconductor substrate to form a surface doping region in the edge termination area, the surface doping region having a net conductivity type of the first conductivity type, wherein the active area comprises at least portions of the body region and a plurality of spicular trenches each comprising a field electrode and extending from the first side through the body region and into the drift region, each of the spicular trenches in the active area comprising a lower end, the lower ends together defining a lower end of the upper drift region extending towards the first side, the lower drift region extending from the lower end of the upper drift region towards the second side, wherein the edge termination area comprises a plurality of spicular termination trenches extending from the first side at least into the upper drift region, wherein the surface doping region is spaced apart from the lower end of the upper drift region, wherein the surface doping region is only formed in an outer part of the edge termination area extending to the lateral rim, wherein the upper drift region extends to the first side in an inner part of the edge termination area next to the active area.

* * * * *

UNITED STATES PATENT AND TRADEMARK OFFICE
CERTIFICATE OF CORRECTION

PATENT NO. : 10,727,331 B2
APPLICATION NO. : 16/023433
DATED : July 28, 2020
INVENTOR(S) : C. Ouvrard et al.

It is certified that error appears in the above-identified patent and that said Letters Patent is hereby corrected as shown below:

In the Claims

Column 17, Line 43 (Claim 6, Line 7), please change "extends" to --extend--.

Signed and Sealed this
Third Day of September, 2024

Katherine Kelly Vidal
*Director of the United States Patent and Trademark Office*